(12) United States Patent
Hung et al.

(10) Patent No.: US 12,464,647 B2
(45) Date of Patent: Nov. 4, 2025

(54) TRIANGULAR BOARD ASSEMBLY FOR SOLID STATE DRIVE

(71) Applicant: SK Hynix NAND Product Solutions Corp., Rancho Cordova, CA (US)

(72) Inventors: John Hung, Vancouver (CA); Andrew Morning-Smith, Vancouver (CA); Kai-Uwe Schmidt, Vancouver (CA); Paul Gwin, Orangevale, CA (US); Nan Allison Yao, Regina (CA)

(*) Notice: Subject to any disclaimer, the term of this patent is extended or adjusted under 35 U.S.C. 154(b) by 1027 days.

(21) Appl. No.: 17/133,836

(22) Filed: Dec. 24, 2020

(65) Prior Publication Data

US 2021/0120672 A1 Apr. 22, 2021

(51) Int. Cl.
  H05K 1/14 (2006.01)
  H05K 1/02 (2006.01)
  H05K 7/20 (2006.01)

(52) U.S. Cl.
  CPC ........... H05K 1/148 (2013.01); H05K 1/0203 (2013.01); H05K 7/2039 (2013.01); H05K 2201/046 (2013.01); H05K 2201/064 (2013.01); H05K 2201/066 (2013.01); H05K 2201/10159 (2013.01)

(58) Field of Classification Search
  CPC ............... H05K 1/148; H05K 7/2039; H05K 2201/046; H05K 2201/056; H05K 1/0203; H05K 2201/064; H05K 2201/066
See application file for complete search history.

(56) References Cited

U.S. PATENT DOCUMENTS

| | | | | |
|---|---|---|---|---|
| 4,200,347 A * | 4/1980 | Sinclair | ............... | H01R 12/716 439/70 |
| 4,227,238 A * | 10/1980 | Saito | ....................... | H05K 7/12 361/801 |
| 4,479,383 A * | 10/1984 | Bravenec | ............. | H05K 7/2039 73/152.01 |
| 4,547,833 A * | 10/1985 | Sharp | ................... | H05K 7/1417 175/325.4 |
| 4,764,414 A * | 8/1988 | Beun | ...................... | H05K 3/366 428/209 |
| 6,031,730 A * | 2/2000 | Kroske | .................. | H01R 12/52 439/74 |
| 6,321,443 B1 * | 11/2001 | Barte | .................... | H01L 25/162 257/E23.079 |
| 6,778,389 B1 * | 8/2004 | Glovatsky | ............. | H05K 1/189 361/720 |
| 8,746,921 B1 * | 6/2014 | Bigge | ..................... | G09F 13/04 362/225 |
| 9,807,914 B2 * | 10/2017 | Liu | ....................... | H01L 25/072 |
| 9,955,596 B2 * | 4/2018 | Voss | ...................... | H05K 3/361 |
| 10,291,698 B2 * | 5/2019 | Hulick | ................. | H01Q 9/0414 |
| 10,342,152 B2 * | 7/2019 | Harrer | ................. | H05K 7/1427 |
| 10,615,514 B2 * | 4/2020 | Lee | ...................... | H01Q 21/205 |
| 10,729,029 B2 * | 7/2020 | Logan | .................. | H05K 7/1417 |
| 10,798,833 B1 * | 10/2020 | Hsieh | ................... | H05K 1/189 |

(Continued)

Primary Examiner — Allen L Parker
Assistant Examiner — Douglas R Burtner
(74) Attorney, Agent, or Firm — Haley Guiliano LLP (57) ABSTRACT

An embodiment of an electronic apparatus comprises a main board, a wing board electrically coupled to the main board by a flexible connector along an edge of the main board, wherein the wing board is arranged at an angle that is non-parallel with respect to the main board. Other embodiments are disclosed and claimed.

6 Claims, 9 Drawing Sheets

(56) References Cited

U.S. PATENT DOCUMENTS

| | | | |
|---|---|---|---|
| 10,910,450 B2* | 2/2021 | Huang | H10K 77/111 |
| 11,414,220 B2* | 8/2022 | Izu | B64G 1/503 |
| 2005/0162840 A1* | 7/2005 | Morita | H05K 1/147 |
| | | | 174/254 |
| 2005/0185951 A1* | 8/2005 | Terada | G03B 17/00 |
| | | | 396/535 |
| 2008/0093110 A1* | 4/2008 | Bagung | H05K 1/0278 |
| | | | 174/254 |
| 2008/0192428 A1* | 8/2008 | Clayton | H05K 7/20727 |
| | | | 361/679.53 |
| 2009/0183364 A1* | 7/2009 | Bartley | H05K 1/147 |
| | | | 29/832 |
| 2010/0008034 A1* | 1/2010 | Hinkle | G06F 1/20 |
| | | | 361/679.31 |
| 2011/0047789 A1* | 3/2011 | Lyders | H05K 1/118 |
| | | | 29/745 |
| 2012/0238045 A1* | 9/2012 | Roberts | F21K 9/90 |
| | | | 438/28 |
| 2014/0241062 A1* | 8/2014 | Jeseritz | G11C 5/04 |
| | | | 365/185.17 |
| 2014/0371530 A1* | 12/2014 | Wieters | G02B 23/2476 |
| | | | 600/109 |
| 2015/0016041 A1* | 1/2015 | Muro | G06F 1/1683 |
| | | | 361/679.55 |
| 2015/0055345 A1* | 2/2015 | Ohl | F21V 23/06 |
| | | | 362/249.04 |
| 2015/0065840 A1* | 3/2015 | Bailey | H05K 1/0283 |
| | | | 174/251 |
| 2015/0156885 A1* | 6/2015 | Ono | H05K 3/3494 |
| | | | 228/256 |
| 2015/0264798 A1* | 9/2015 | Stanley | H05K 3/284 |
| | | | 361/749 |
| 2015/0342050 A1* | 11/2015 | Jiang | H05K 1/181 |
| | | | 361/749 |
| 2016/0037623 A1* | 2/2016 | Fjelstad | H05K 1/148 |
| | | | 361/720 |
| 2017/0020029 A1* | 1/2017 | Lin | H02J 9/06 |
| 2017/0020030 A1* | 1/2017 | Lin | H02J 9/06 |
| 2017/0064845 A1* | 3/2017 | Jung | G02F 1/133305 |
| 2017/0111993 A1* | 4/2017 | Lang | H05K 3/361 |
| 2017/0241624 A1* | 8/2017 | Badia | H05K 1/028 |
| 2018/0255659 A1* | 9/2018 | Harrer | H05K 1/181 |
| 2019/0025143 A1* | 1/2019 | Doll | G01L 5/1627 |
| 2019/0350081 A1* | 11/2019 | Park | H05K 1/118 |
| 2022/0159837 A1* | 5/2022 | Holec | H01R 12/721 |
| 2024/0200757 A1* | 6/2024 | Chua | H05K 1/0203 |

\* cited by examiner

TRIANGULAR BOARD ASSEMBLY FOR SOLID STATE DRIVE

BACKGROUND

A solid state drive (SSD) utilizes nonvolatile memory (NVM) to persistently store data. Some SSDs may use flash memory, such as NAND-based flash memory. INTEL OPTANE technology is another class of NVM, that may utilize three-dimensional crosspoint memory media. The high speed and density of INTEL OPTANE technology may eliminate processing bottlenecks and improve performance in demanding applications such as big data, high performance computing (HPC), virtualization, storage, cloud, gaming, etc. For example, INTEL OPTANE SSDs may be utilized for data center applications. SSD devices may have any of a variety of form factors. For example, the Enterprise & Datacenter SSD Form Factor (EDSFF) standard (edsff-spec.org) defines several form factors, including an Enterprise and Datacenter 1U Short SSD Form Factor (hereinafter referred to as form factor "E1.S", see SFF-TA-1006 Specification, Rev 1.4 Mar. 27, 2020, edsffspec.org).

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, JESD209-4 for LPDDR4, and JESD79-5 for DDR5 (these standards are available at jedec.org). Such standards (and similar standards) may be referred to as DDR-based standards and communication interfaces of the storage devices that implement such standards may be referred to as DDR-based interfaces.

NV memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, JESD230, or other suitable standard (the JEDEC standards cited herein are available at jedec.org).

Figure 1A:
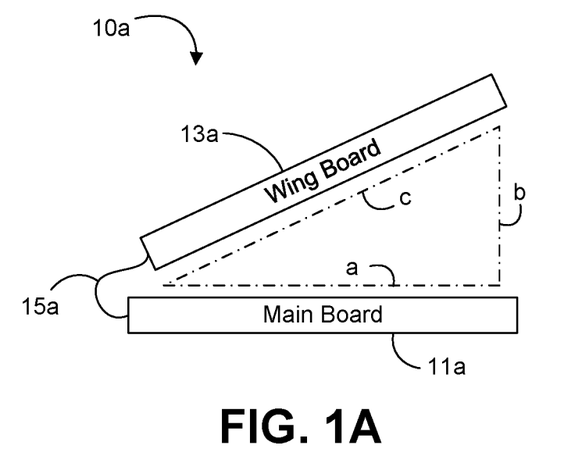
FIGS. 1A to 1C are front view block diagrams of respective examples of an electronic apparatus according to an embodiment.

With reference to FIG. 1A, an embodiment of an electronic apparatus 10a may include a main board 11a, a wing board 13a electrically coupled to the main board 11a by a flexible connector 15a along an edge of the main board 11a. In some embodiments, the wing board 13a may be arranged at an angle that is non-parallel with respect to the main board 11a. For example, the wing board 13a may be slanted with respect to the main board 11a in a triangular arrangement. As illustrated, the triangular arrangement may be substantially a right triangle arrangement where $a^2+b^2=c^2$. Advantageously, c is longer than both a and b, providing potentially more board area for the wing board 13a in some enclosures.

Figure 1B:
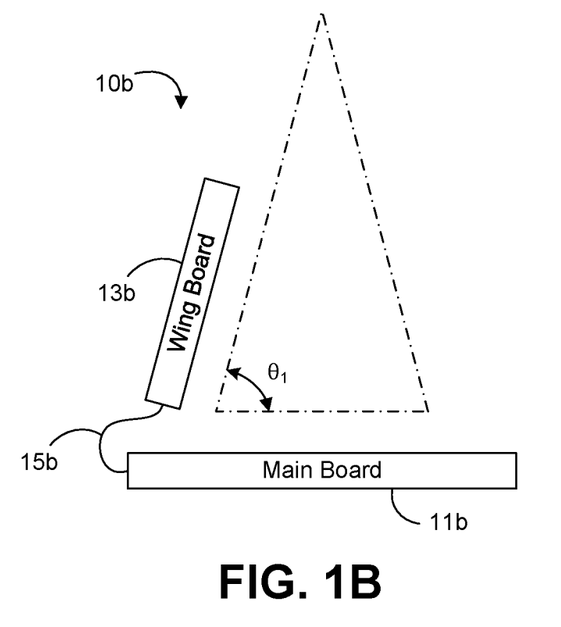

With reference to FIG. 1B, an embodiment of an electronic apparatus 10b may include a main board 11b, a wing board 13b electrically coupled to the main board 11b by a flexible connector 15b along an edge of the main board 11b. In some embodiments, the wing board 13b may be arranged at an angle that is non-parallel with respect to the main board 11b. For example, the wing board 13b may be slanted with respect to the main board 11 in a triangular arrangement. In some embodiments, the wing board 13b may be arranged at a first angle $\theta_1$ that is non-parallel with respect to the main board 11b.

Figure 1C:
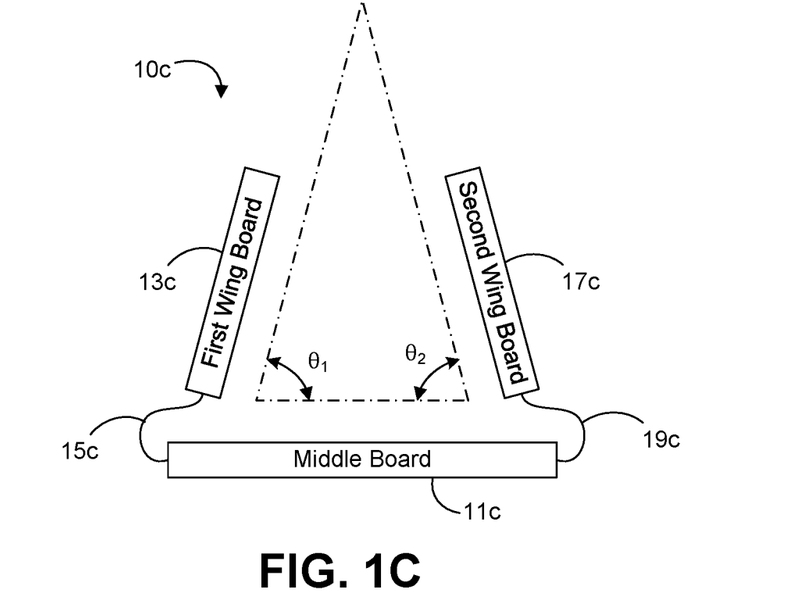

With reference to FIG. 1C, an embodiment of an electronic apparatus 10c may include a middle board 11c, a first wing board 13c electrically coupled to the middle board 11c by a first flexible connector 15c along a first edge of the middle board 11c, and a second wing board 17c electrically coupled to the middle board 11c by a second flexible connector 19c along a second edge of the middle board 11c. In some embodiments, the first wing board 13c may be arranged at a first angle $\theta_1$ that is non-parallel with respect to the middle board 11c, and the second wing board 17c may be arranged at a second angle $\theta_2$ that is non-parallel with respect to the middle board 11c. For example, the second edge of the middle board 11c may be opposite to the first edge of the middle board 11c, and the middle board 11c, the first wing board 13c, and the second wing board 17c may have a substantially triangular, tented arrangement with respect to each other. As illustrated, the triangular arrangement may be substantially an isosceles triangle arrangement where the first angle $\theta_1$ and the second angle $\theta_2$ are both acute angles with respect to the opposite legs of the triangle and with a vertical axis of symmetry where the first angle $\theta_1$ and the second angle $\theta_2$ mirror each other. In other embodiments, the triangular arrangement may be scalene where there is no vertical axis of symmetry where the first angle $\theta1$ and the second angle $\theta_2$ do not mirror each other.

Figure 2:
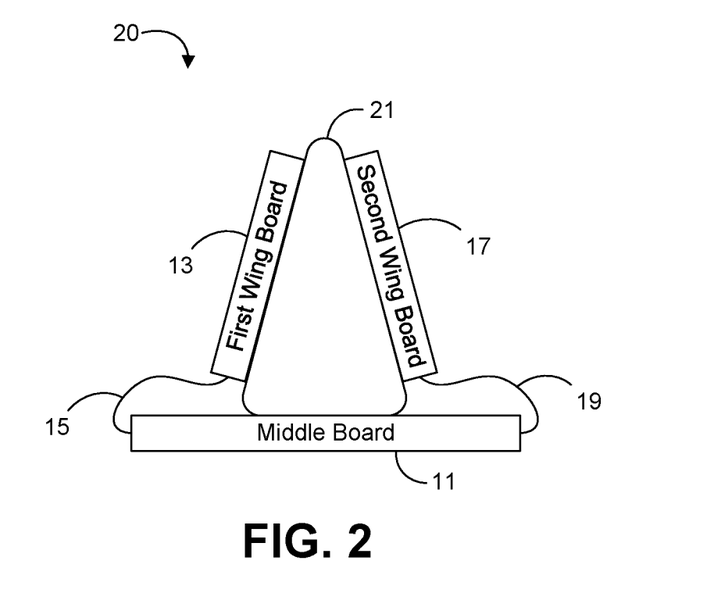
FIG. 2 is a front view block diagram of another example of an electronic apparatus according to an embodiment.

With reference to FIG. 2, an embodiment of an electronic apparatus 20 may include similar components as described above in connection with the electronic apparatus 10 which are indicated with like reference numerals. The apparatus 20 may further include a substantially triangular thermally conductive support structure 21 in mechanical and thermal communication with a first side of each of the middle board 11, the first wing board 13, and the second wing board 17. For example, the thermally conductive support structure 21 may be a solid metal heatsink to dissipate heat from the three boards. The first side of each of the three boards may include heat generating electrical components (e.g., processors, controllers, media packages, etc.) which may be placed in contact with the thermally conductive support structure 21. For example, thermal interface material (TIM) may be disposed between the thermally conductive support structure 21 and one or more electrical components on the first side of each of the middle board 11, the first wing board 13, and the second wing board 17.

Figure 3:
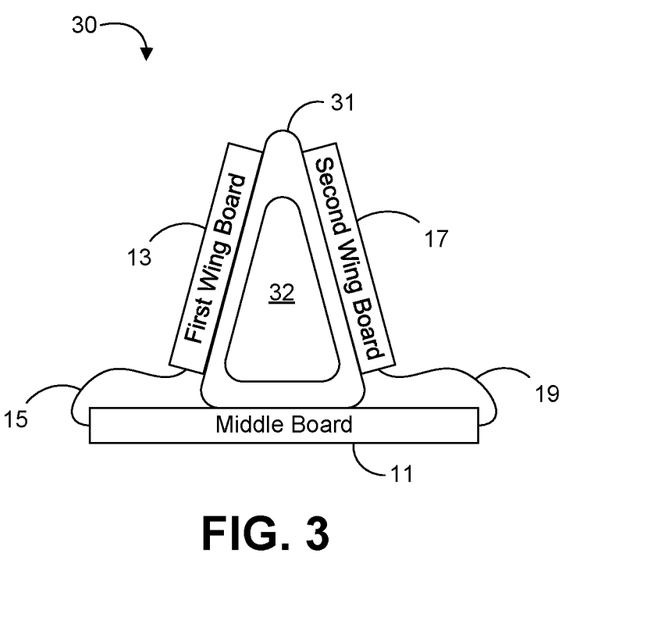
FIG. 3 is a front view block diagram of another example of an electronic apparatus according to an embodiment.

With reference to FIG. 3, an embodiment of an electronic apparatus 30 may include similar components as described above in connection with the electronic apparatus 10 which are indicated with like reference numerals. In this alternative embodiment, a substantially triangular thermally conductive support structure 31 provides an interior air flow channel 32. For example, the thermally conductive support structure 31 may be a hollow metal heatsink to dissipate heat from the three boards. In some embodiments, the thermally conductive support structure 31 may comprise a substantially triangular metal extrusion with a substantially triangular interior air flow channel 32.

Figure 4:
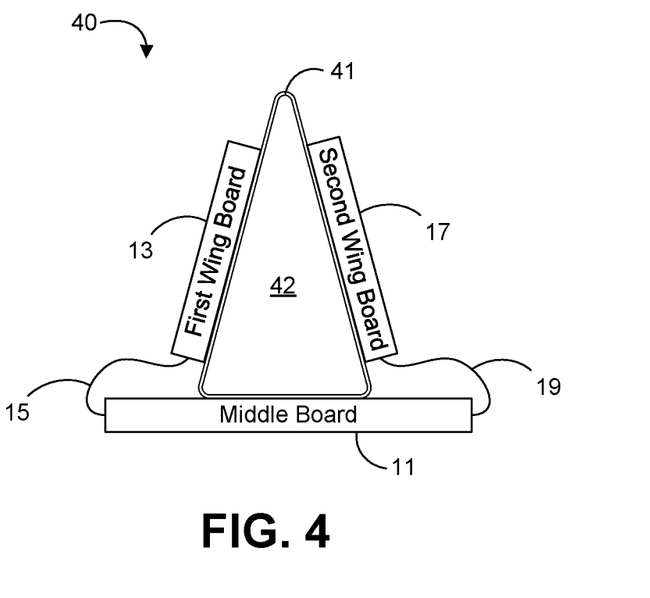
FIG. 4 is a front view block diagram of another example of an electronic apparatus according to an embodiment.

With reference to FIG. 4, an embodiment of an electronic apparatus 40 may include similar components as described above in connection with the electronic apparatus 10 which are indicated with like reference numerals. In this alternative embodiment, a substantially triangular thermally conductive support structure 41 comprises a sheet metal structure in a substantially triangular shape with a substantially triangular interior air flow channel 42. For example, sheet metal may be bent, folded, stamped, or otherwise formed into the triangular shape. Alternatively, the thermally conductive support structure 41 may be manufactured using any suitable material and manufacturing technique to provide a thin-walled structure (e.g., extrusion, stamped, plate, etc.).

Figure 5:
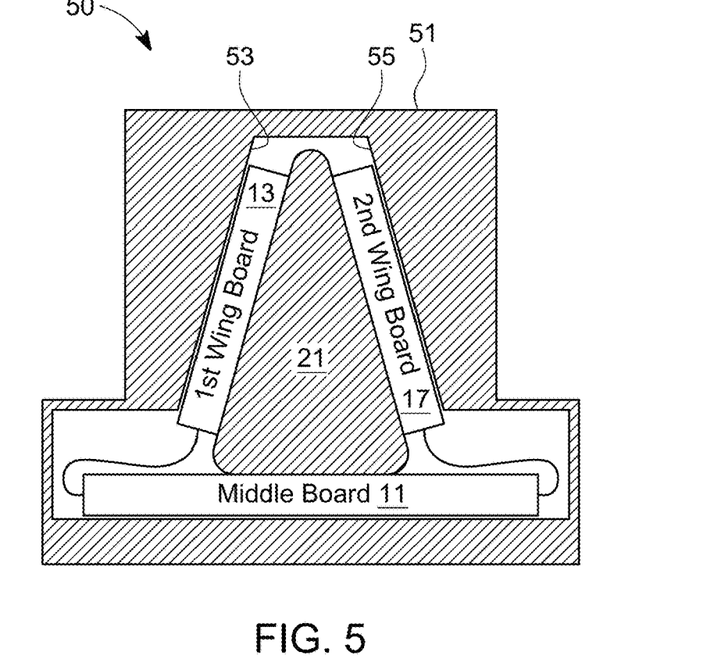
FIG. 5 is a front view, partial cross-section block diagram of another example of an electronic apparatus according to an embodiment.

With reference to FIG. 5, an embodiment of an electronic apparatus 50 may include similar components as described above in connection with the electronic apparatus 20 which are indicated with like reference numerals. The apparatus 50 may further include a thermally conductive enclosure 51 disposed around the middle board 11, the first wing board 13, the second wing board 17, and the thermally conductive support structure 21, the thermally conductive enclosure 51 in mechanical and thermal communication with a second side of each of the middle board 11, the first wing board 13, and the second wing board 17. For example, the thermally conductive enclosure 51 may function as a metal heatsink to dissipate heat from the three boards. The second side of each of the three boards may include heat generating electrical components (e.g., processors, controllers, media packages, etc.) which may be placed in contact with the thermally conductive enclosure 51. For example, TIM may be disposed between the thermally conductive enclosure 51 and one or more electrical components on the second side of each of the middle board 11, the first wing board 13, and the second wing board 17. In some embodiments, the thermally conductive enclosure 51 comprises a first wall 53 with a same angle as the first angle $\theta_1$ and positioned in mechanical and thermal communication with the second side of the first wing board 13, and a second wall 55 with a same angle as the second angle $\theta_2$ and positioned in mechanical and thermal communication with the second side of the second wing board 17. In some embodiments, the enclosure 51 may be composed of one or more pieces.

Figure 6:
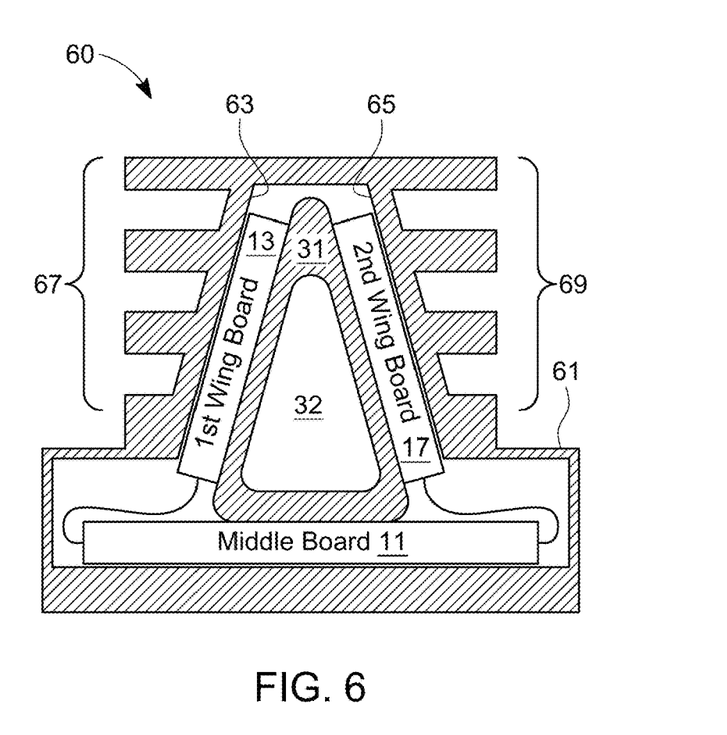
FIG. 6 is a front view, partial cross-section block diagram of another example of an electronic apparatus according to an embodiment.

With reference to FIG. 6, an embodiment of an electronic apparatus 60 may include similar components as described above in connection with the electronic apparatus 30 which are indicated with like reference numerals. The apparatus 60 may further include a thermally conductive enclosure 61 disposed around the middle board 11, the first wing board 13, the second wing board 17, and the thermally conductive support structure 31, the thermally conductive enclosure 61 in mechanical and thermal communication with a second side of each of the middle board 11, the first wing board 13, and the second wing board 17. In some embodiments, the thermally conductive enclosure 61 comprises a first wall 63 with a same angle as the first angle $\theta_1$ and positioned in mechanical and thermal communication with the second side of the first wing board 13, and a second wall 65 with a same angle as the second angle $\theta_2$ and positioned in mechanical and thermal communication with the second side of the second wing board 17. The thermally conductive enclosure 61 may also comprise a first set of fins 67 disposed on an exterior side of the first wall 63, and a second set of fins 69 disposed on an exterior side of the second wall 65.

Some embodiments may provide a triangular SSD PCB configuration to enable higher memory capacity. In order to provide more capacity, an SSD device may benefit from increasing or maximizing the number of media packages utilized while still maintaining a desired SSD form factor that fits in a target system. In a SSD device, a printed circuit board that includes a controller component and nonvolatile storage components (e.g., NAND devices) may be referred to herein as a SSD main board. Some embodiments may advantageously provide a multiple-board assembly where the SSD main board is flexibly connected to one or more wings to increase the storage capacity while fitting within a desired form factor. For example, some systems may benefit from higher capacity SSDs in the E1.S form factor that utilize INTEL OPTANE technology. Advantageously, some embodiments may provide a higher capacity OPTANE SSD in the E1.S form factor.

Some techniques for increasing memory capacity may include putting more die within a media package, putting more media packages on a single SSD main board, utilizing multiple boards in a stacked arrangement, and utilizing multiple boards in a perpendicular arrangement. A problem with putting more dies per package includes that the yield for higher dies per package is much lower, increasing the cost. A problem with putting more media packages on a single board is that there is limited space on the single board and higher capacity may be desired than can fit on the single board.

Figure 7:
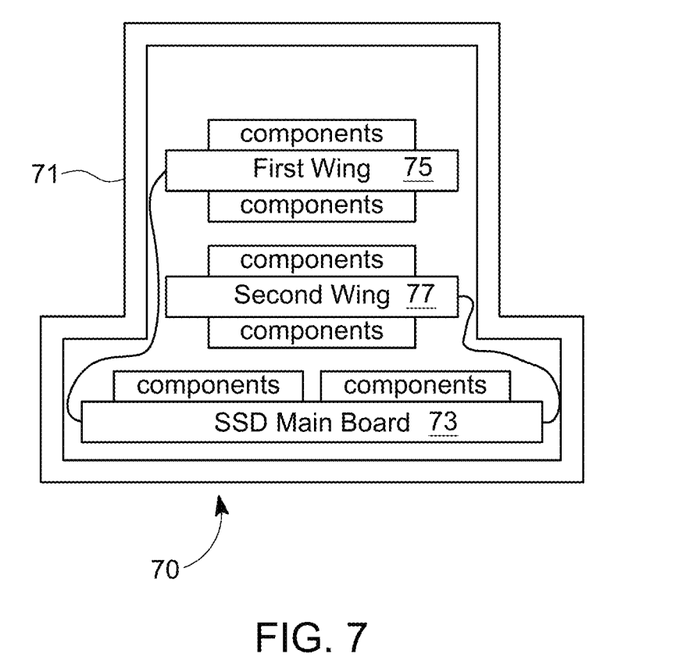
FIG. 7 is a front view block diagram of an example of a SSD device according to an embodiment.

With reference to FIG. 7, an embodiment of a SSD device 70 includes an enclosure 71 having an E1.S form factor. The SSD device 70 includes a triple-board assembly, with folds on both sides of a SSD main board 73, in a stacked board arrangement. A first wing 75 may be electrically coupled to a first edge of the SSD main board 73 by a first flex circuit and a second wing 77 may be electrically coupled to a second edge of the SSD main board 73 by a second flex circuit. The wings 75, 77 are folded flat, parallel to the SSD main board 73, to fit in the enclosure 71 with the E1.S (e.g., a 25 mm width) form factor. A problem with the stacked board arrangement is that the stacked arrangement may not dissipate heat as well and may create an air dam. For some form factors (e.g., the E1.S form factor), there is less board space for the media packages in the stacked arrangement, due to the specifications.

Figure 8:
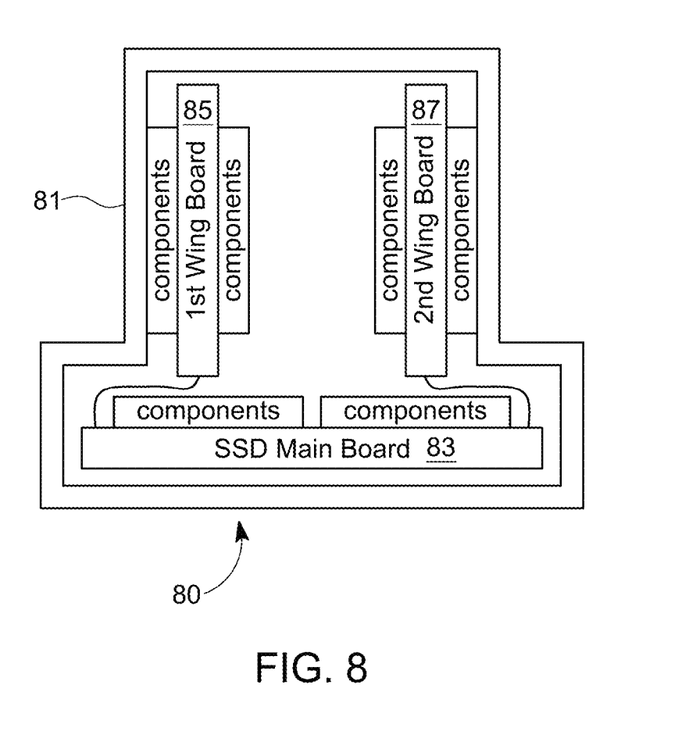
FIG. 8 is a front view block diagram of another example of a SSD device according to an embodiment.

With reference to FIG. 8, an embodiment of a SSD device 80 includes an enclosure 81 having an E1.S form factor. The SSD device 80 includes a triple-board assembly, with folds on both sides of a SSD main board 83, in a perpendicular board arrangement. A first wing 85 may be electrically coupled to a first edge of the SSD main board 83 by a first flex circuit and a second wing 87 may be electrically coupled to a second edge of the SSD main board 83 by a second flex circuit. The wings 85, 87 are positioned along walls of the enclosure 81, parallel to the SSD main board 83, to fit in the E1.S (e.g., a 25 mm width) form factor. A problem with the perpendicular board arrangement is that dimensions of the perpendicular wings 85, 87 are limited by the dimensions of the enclosure 81, which provides less board space for the media packages due to the shorter width.

To provide higher capacity, some embodiments provide more media packages than can fit on a single main board. Some embodiments utilize multiple boards within the standard E1.S 25 mm form factor to fit more media packages. Utilizing multiple boards within the standard E1.S 25 mm form factor to fit more media packages, however, increases power consumption and heat. Some embodiments provide an arrangement of the multiple boards which improves the ability to dissipate heat within the enclosure of the SSD. For example, some embodiments provide technology for a rigid-flex triple board assembly, with folds on both sides of the SSD main board. Some embodiments provide a triangular assembly which advantageously allows extra wing board space (e.g., versus perpendicular or stacked boards) to fit more media packages. Advantageously, some embodiments increase or maximize memory on a single SSD device in a standard form factor while reducing sacrifices to other design criteria such as air flow and signal integrity.

Figure 9A:
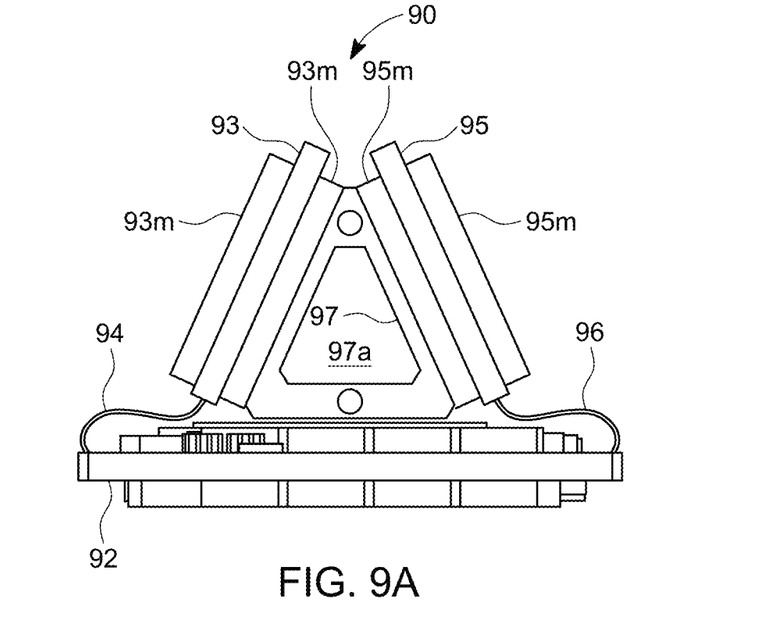
FIG. 9A is a front view block diagram of an example of a SSD assembly according to an embodiment.
Figure 9B:
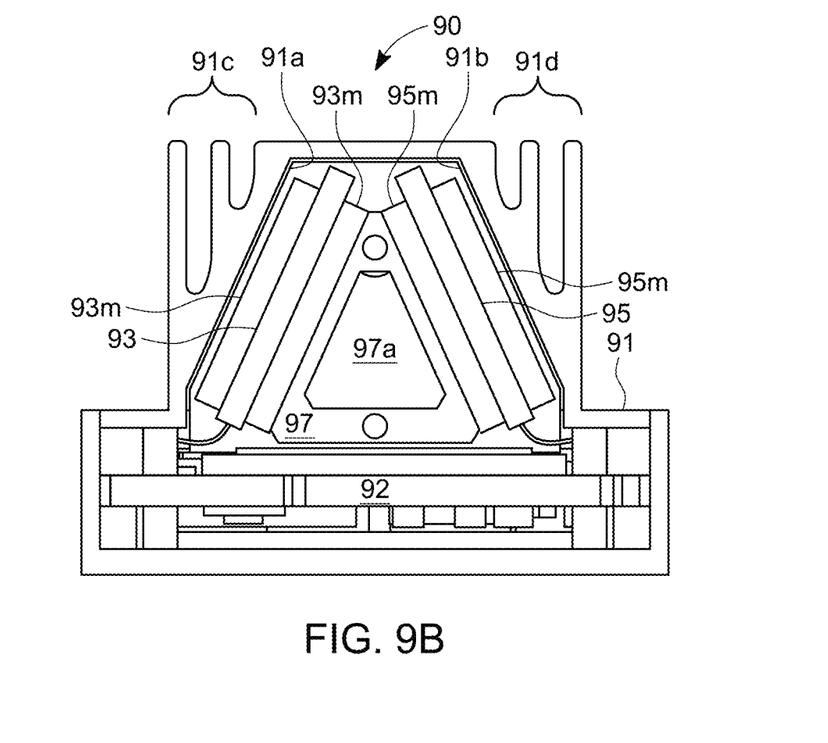
FIG. 9B is a front view block diagram of an example of a SSD apparatus according to an embodiment.
Figure 10A:
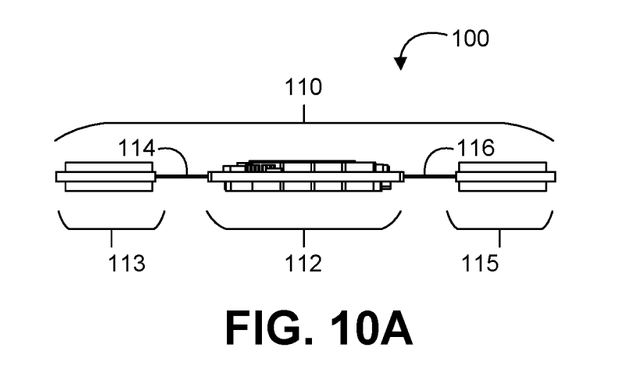
FIGS. 10A to 10D are front, top, and two perspective views, respectively, of another example of a SSD assembly according to an embodiment.
Figure 10B:
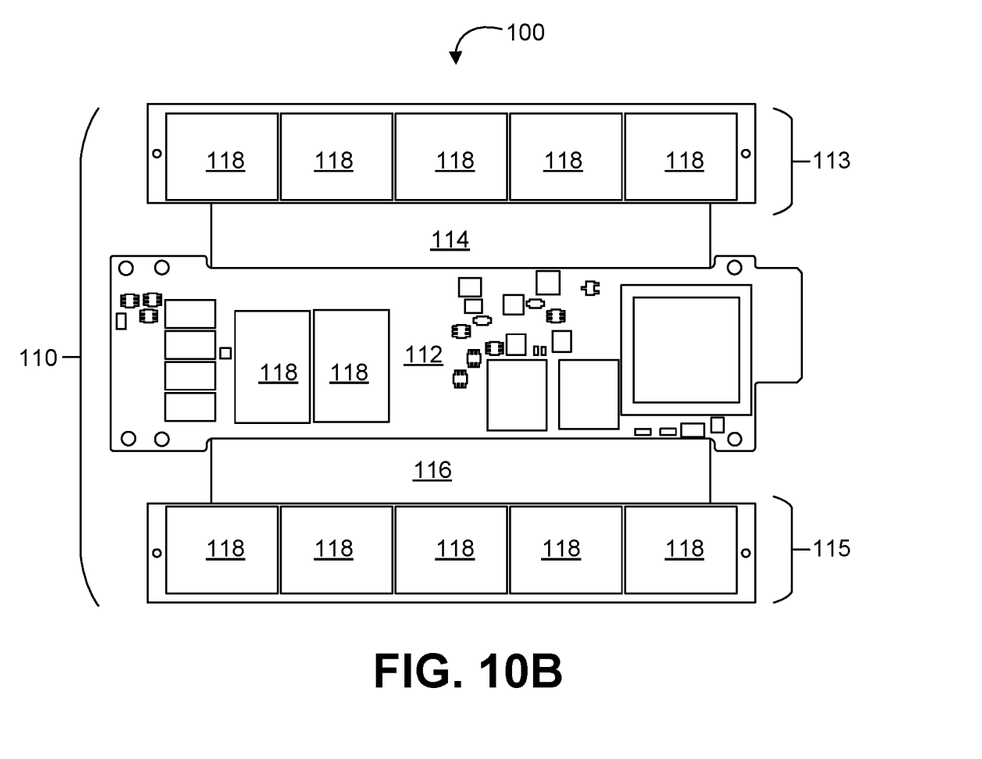
Figure 10C:
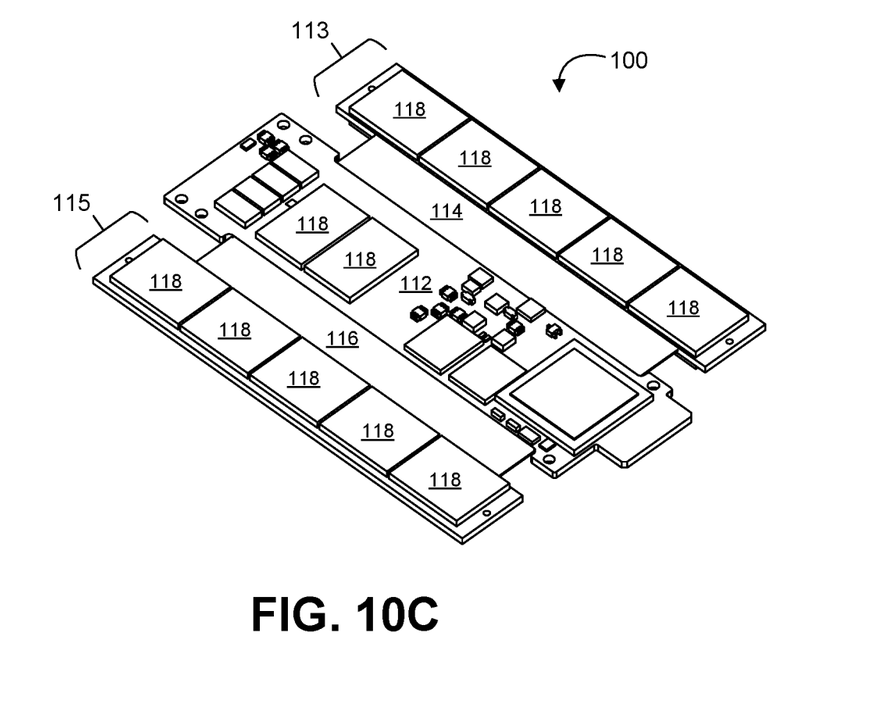
Figure 10D:
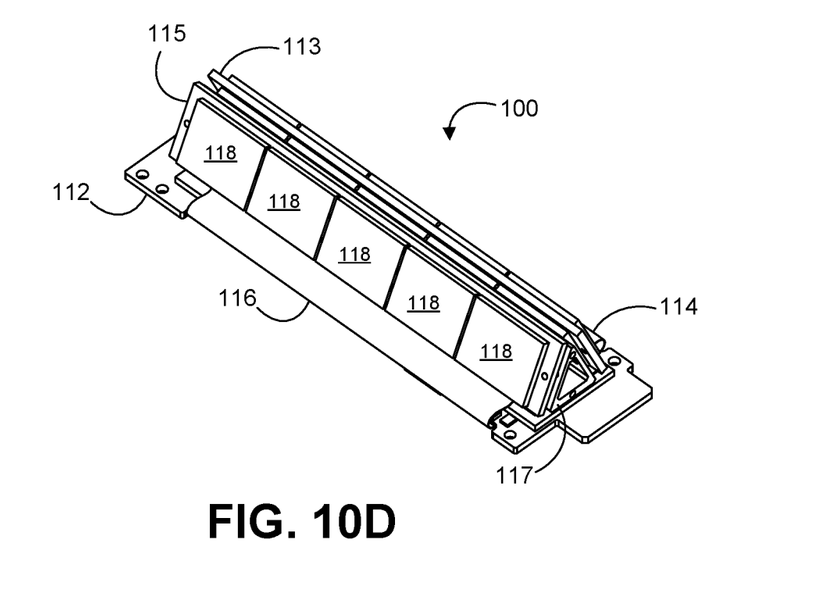

With reference to FIGS. 9A to 9B, an embodiment of a SSD apparatus 90 includes an enclosure 91 having a form factor, a SSD main board 92 disposed within the enclosure 91, a first wing board 93 disposed within the enclosure 91 with two or more media packages 93m disposed thereon electrically coupled to the SSD main board 92 by a first flexible connector 94 along a first edge of the SSD main board 92, and a second wing board 95 disposed within the enclosure 91 with two or more media packages 95m disposed thereon electrically coupled to the SSD main board 92 by a second flexible connector 96 along a second edge of the SSD main board 92 opposite to the first edge of the SSD main board 92. As illustrated, the first wing board 93 is arranged at a first angle that is non-parallel with respect to the SSD main board 92, and the second wing board 95 is arranged at a second angle that is non-parallel with respect to the SSD main board 92. For example, the SSD main board 92, the first wing board 93, and the second wing board 95 have a substantially triangular arrangement with respect to each other.

The apparatus 90 further includes a substantially triangular first heatsink 97 disposed within the enclosure 91 and in mechanical and thermal communication with a first side of each of the SSD main board 92, the first wing board 93, and the second wing board 95. In this embodiment, the first heatsink 97 provides an interior air flow channel 97a. For example, the first heatsink 97 comprise a substantially triangular metal extrusion with a substantially triangular interior air flow channel 97a. In some embodiments, the first heatsink 97 may alternatively comprise a sheet metal structure in a substantially triangular shape with a substantially triangular interior air flow channel. The first side of the SSD main board 92 includes heat generating electrical components (e.g., processors, controllers, media packages, etc.) which, along with the media packages 93m, 95m on the first side of the first and second wing boards 93, 95, may be placed in contact with the first heatsink 97 (e.g., with TIM disposed therebetween).

In this embodiment, the enclosure 91 comprises a second heatsink disposed around the SSD main board 92, the first wing board 93, and the second wing board 95 and in mechanical and thermal communication with a second side of each of the SSD main board 92, the first wing board 93, and the second wing board 95. The second heatsink comprises a first wall 91a with a same angle as the first angle and positioned in mechanical and thermal communication with the second side of the first wing board 93, and a second wall 91b with a same angle as the second angle and positioned in mechanical and thermal communication with the second side of the second wing board 95. As illustrated, the second heatsink comprises a first set of fins 91c disposed on an exterior side of the first wall 91a, and a second set of fins 91d disposed on an exterior side of the second wall 91b. The second side of the SSD main board 92 may also include heat generating electrical components (e.g., processors, controllers, media packages, etc.) which, along with the media packages 93m, 95m on the second side of the first and second wing boards 93, 95, may be placed in contact with the second heatsink (e.g., with TIM disposed therebetween). In some embodiments, the form factor of the enclosure 91 comprises dimensions that conform to a one rack unit short SSD form factor (e.g., an E1.S form factor), and the two or more media packages of the first and second wing boards 93, 95 comprise 3D crosspoint memory media (e.g., INTEL OPTANE technology).

With reference to FIGS. 10A to 10D, an embodiment of a SSD sub-assembly 100 utilizes a triple-board assembly 110, with folds on both sides of a SSD main board 112. The first wing 113 may be electrically coupled to the first edge of the SSD main board 112 by a flex circuit 114 and the second wing 115 may be electrically coupled to a second edge of the SSD main board 112 by a second flex circuit 116. The wings 113, 115 are folded in a triangular configuration (FIG. 10D) to fit in an E1.S (e.g., a 25 mm width) form factor enclosure and supported with a triangular extrusion 117 in the middle to create the sub-assembly 100 for production as well as improve cross-sectional air flow area.

The triangular configuration supports extra width on the wing boards 113, 115 due to the angular placement in the enclosure compared to other configurations. In some embodiments, five (5) OPTANE media packages 118 may fit on each side of the first and second wings, providing twenty (20) media packages 118 to be placed on the wing boards 113, 115 to increase memory capacity of a SSD device (e.g., in addition to six (6) media packages that may fit on the SSD main board). Embodiments of a triangular wing configuration dissipates heat and allows airflow to both sides of the media packages and airflow to an application-specific IC (ASIC) on the SSD main board 112, thereby improving thermal properties in order to meet thermal boundary condition requirements.

In contrast, heat cannot spread as well due to media packages on top in a stacked configuration, which reduces or eliminates airflow completely to one wing board and the ASIC (e.g., see FIG. 7), and a perpendicular configuration decreases board area for media packages (e.g., see FIG. 8). For example, a perpendicular configuration may require a 6% decrease in width of the wing boards to fit in to the E1.S 25 mm form factor, as compared to embodiments of a triangular configuration. The decrease in width reduces the amount of space for media packages and may not provide enough room for additional passive components or board edge clearance. Advantageously, while meeting various restrictions of the E1.S 25 mm enclosure specifications, embodiments of a triangular configuration improve or optimize board space and thermal properties while maintaining signal integrity and manufacturability.

Figure 11:
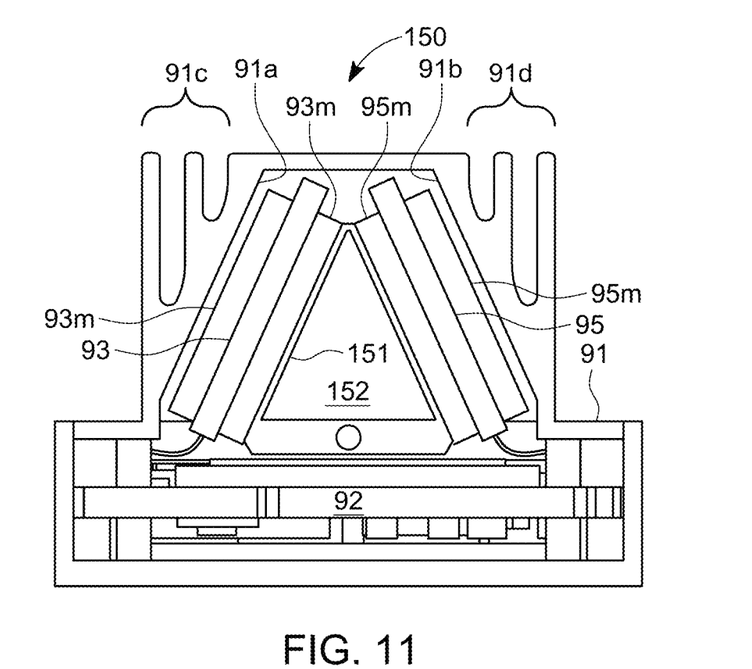
FIG. 11 is a front view block diagram of another example of a SSD apparatus according to an embodiment.

With reference to FIG. 11, an embodiment of a SSD apparatus 150 may include similar components as described above in connection with the SSD apparatus 90 (FIGS. 9A to 9B) which are indicated with like reference numerals. In this alternative embodiment, a triangular thin walled heatsink 151 supports the first and second wing boards 93, 95 and provides a substantially triangular interior air flow channel 152. In some embodiments, to improve or optimize the thermal performances of a triangular configuration, the walls of the triangular support structure in the center may be thinned to increase the cross-sectional airflow area. Metal extrusion technology may have restrictions on the minimum thickness for an extrusion. To increase or maximize this area, for example, sheet metal may be used for portions of the triangle support (e.g., which may be much thinner than the minimum thickness of some extrusions). Embodiments of thinner triangular support structures may almost double the airflow area, advantageously achieving thermal performances which are suitable in a high capacity data center environment.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as brackets, alignment pins and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An electronic apparatus, comprising:
   a main board comprising a first surface which extends between a first edge of the main board and a second edge of the main board, wherein the second edge is opposite the first edge, the first surface comprising a first portion which extends to the first edge, a second portion which extends to the second edge, and a third portion between the first portion and the second portion, wherein the first portion, the second portion, and the third portion are substantially equal in size;
   a first wing board electrically coupled to the main board by a first flexible connector along the first edge, wherein the first wing board is disposed over the third portion, wherein the first flexible connector extends horizontally across the first portion to each of the first wing board and the first edge, and wherein the first wing board is arranged at a first angle that is non-parallel with respect to the main board,
   a second wing board electrically coupled to the main board by a second flexible connector along the second edge, wherein the second wing board is disposed over the third portion, wherein the second flexible connector extends horizontally across the second portion to each of the second wing board and the second edge, and wherein the second wing board is arranged at a second angle that is non-parallel with respect to the main board; and
   a substantially triangular thermally conductive support structure disposed over the third portion, wherein:
   the substantially triangular thermally conductive support structure is not in contact with the first portion and the second portion,
   the substantially triangular thermally conductive support structure is not in alignment with the first portion and the second portion when viewed in a direction perpendicular to the first surface of the main board, and
   the substantially triangular thermally conductive support structure is in mechanical and thermal communication with respective first sides of each of the main board, the first wing board, and the second wing board.

2. The apparatus of claim 1, wherein the thermally conductive support structure provides an interior air flow channel.

3. The apparatus of claim 2, wherein the thermally conductive support structure comprises a substantially triangular metal extrusion with a substantially triangular interior air flow channel.

4. The apparatus of claim 1, further comprising:
   a thermally conductive enclosure disposed around the main board, the first wing board, the second wing board, and the thermally conductive support structure, the thermally conductive enclosure in mechanical and thermal communication with respective second sides of each of the main board, the first wing board, and the second wing board.

5. The apparatus of claim 4, wherein the thermally conductive enclosure comprises:
   a first wall with a same angle as the first angle and positioned in mechanical and thermal communication with the second side of the first wing board; and
   a second wall with a same angle as the second angle and positioned in mechanical and thermal communication with the second side of the second wing board.

6. The apparatus of claim 5, wherein the thermally conductive enclosure comprises:
   a first set of fins disposed on an exterior side of the first wall; and
   a second set of fins disposed on an exterior side of the second wall.

* * * * *